US009711521B2

(12) United States Patent
Syu et al.

(10) Patent No.: US 9,711,521 B2
(45) Date of Patent: Jul. 18, 2017

(54) SUBSTRATE FABRICATION METHOD TO IMPROVE RF (RADIO FREQUENCY) DEVICE PERFORMANCE

(71) Applicant: Taiwan Semiconductor Manufacturing Co., Ltd., Hsin-Chu (TW)

(72) Inventors: Yong-En Syu, Tainan (TW); Kuan-Chi Tsai, Kaohsiung (TW); Kuo-Yu Cheng, Tainan (TW); Keng-Yu Chen, Tainan (TW); Shih-Shiung Chen, Tainan (TW); Shao-Yu Chen, Tainan (TW); Wei-Kung Tsai, Tainan (TW); Yu-Lung Yeh, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/840,155

(22) Filed: Aug. 31, 2015

(65) Prior Publication Data

US 2017/0062452 A1     Mar. 2, 2017

(51) Int. Cl.
| H01L 29/06 | (2006.01) |
| H01L 27/11573 | (2017.01) |
| H01L 29/792 | (2006.01) |
| H01L 29/66 | (2006.01) |
| H01L 29/423 | (2006.01) |
| H01L 27/11575 | (2017.01) |

(52) U.S. Cl.
CPC .. *H01L 27/11573* (2013.01); *H01L 27/11575* (2013.01); *H01L 29/0649* (2013.01); *H01L 29/4234* (2013.01); *H01L 29/66833* (2013.01); *H01L 29/792* (2013.01)

(58) Field of Classification Search
CPC .............. H01L 29/06; H01L 29/42324; H01L 29/7926; H01L 29/0649; H01L 29/0626; H01L 29/0653; H01L 29/7923; H01L 29/0607; H01L 29/0642; H01L 29/0646
USPC .......................... 257/324, 325, 43, 314, 330
See application file for complete search history.

(56) References Cited

U.S. PATENT DOCUMENTS

| 8,076,750 B1 | 12/2011 | Kerr et al. |
| 8,466,036 B2 | 6/2013 | Brindle et al. |
| 2002/0187619 A1 | 12/2002 | Kleinhenz et al. |

(Continued)

FOREIGN PATENT DOCUMENTS

JP          2014-039280     *  2/2014  ............. H01L 29/06

OTHER PUBLICATIONS

Notice of Allowance Dated Oct. 13, 2015 U.S. Appl. No. 14/222,785.

(Continued)

*Primary Examiner* — Chuong A Luu
*Assistant Examiner* — Rodolfo D Fortich
(74) *Attorney, Agent, or Firm* — Eschweiler & Potashnik, LLC

(57) ABSTRACT

The present disclosure relates to a semiconductor substrate including, a first silicon layer comprising an upper surface with protrusions extending vertically with respect to the upper surface. An isolation layer is arranged over the upper surface meeting the first silicon layer at an interface, and a second silicon layer is arranged over the isolation layer. A method of manufacturing the semiconductor substrate is also provided.

20 Claims, 5 Drawing Sheets

(56) References Cited

U.S. PATENT DOCUMENTS

| | | | |
|---|---|---|---|
| 2003/0051660 A1 | 3/2003 | Koya et al. | |
| 2011/0129984 A1* | 6/2011 | Funayama | H01L 21/76229 438/424 |
| 2011/0250739 A1 | 10/2011 | Falster et al. | |
| 2012/0161310 A1 | 6/2012 | Brindle et al. | |
| 2013/0089968 A1 | 4/2013 | Usenko | |
| 2015/0004778 A1 | 1/2015 | Botula et al. | |
| 2015/0287745 A1* | 10/2015 | Kato | H01L 27/0688 257/43 |

OTHER PUBLICATIONS

Wijaranakula, et al. "Influence of the preepitaxial annealing and polycrystalline silicon deposition processes on oxygen precipitation and internal gettering in N/N+(100) epitaxial silicon wafers." Journal of Applied Physics 65, 2078. Published in 1989.

Saritas, et al. "Deep States Associated with Oxidation Induced Stacking Faults in RTA p-type Silicon Before and After Cooper Diffusion." Solid-State Electronics, vol. 38, No. 5, pp. 1025-1034. Published in 1995.

Ishihara, et al. "Time and Temperature Dependence of Density of Oxidation-Induced Stacking Faults in Diamond-Lapped Silicon." Japanese Journal of Applied Physics, vol. 23, No. 8, pp. L620-L622. Published in Aug. 1984.

Kuper, et al. "Density of Oxidation-Induced Stacking Faults in Damaged Silicon." Journal of Applied Physics, 60 (4). Published on Aug. 15, 1986.

Wolf, et al. "Highly Resistive Substrate CMOS on SOI for Wireless Front-End Switch Applications." CS MANTECH Conference, May 16-19, 2011, Palm Springs, California, USA.

Iacona, et al. "Roughness of Thermal Oxide Layers Grown on Ion Implanted Silicon Wafers." Journal of Vacuum Science Technology, B 16(2), Mar./Apr. 1998.

Giri, et al. "Formation and annealing of defects during high-temperature processing of ion-implanted epitaxial silicon: the role of dopant implants." Materials Science and Engineering, B71, 186-191. Published in 2000.

Neve, et al. "RF and linear performance of commercial 200 mm trap-rich HRSOI wafers for SoC applications." IEEE, SiRF. Published in 2013.

Lederer, et al. "Substrate loss mechanisms for microstrip and CPW transmission lines on lossy silicon wafers." IEEE MTT-S International Microwave Symposium Digest. IEEE MTT-S International Microwave Symposium, Nov. 2003.

Neve, et al. "Impact of Si substrate resistivity on the non-linear behaviour of RF CPW transmission lines." Proceedings of the 3rd European Microwave Integrated Circuits Conference, Oct. 2008.

U.S. Appl. No. 14/222,785, filed Mar. 24, 2014.

Non-Final Office Action dated May 22, 2015 for U.S. Appl. No. 14/222,785.

U.S. Appl. No. 14/068,353, filed Oct. 31, 2013.

U.S. Appl. No. 14/161,208, filed Jan. 22, 2014.

U.S. Appl. No. 15/051,197, filed Feb. 23, 2016.

Notice of Allowance dated Apr. 26, 2017 in connection with U.S. Appl. No. 15/051,197.

* cited by examiner

SUBSTRATE FABRICATION METHOD TO IMPROVE RF (RADIO FREQUENCY) DEVICE PERFORMANCE

BACKGROUND

Integrated chips are formed on substrates comprising a semiconductor material. Traditionally, integrated chips were formed on bulk substrates comprising a solid layer of semiconductor material. In more recent years, silicon-on-insulator substrates have emerged as an alternative. Silicon-on-insulator (SOI) substrates are substrates that have a thin layer of active silicon separated from an underlying substrate wafer by a layer of insulating material. The layer of insulating material electrically isolates the thin layer of active silicon from the substrate wafer, thereby reducing current leakage of devices formed within the thin layer of active silicon. The thin layer of active silicon also provides for other advantages, such as faster switching times and lower operating voltages, which have made SOI substrates widely used for high volume fabrication of radio frequency (RF) systems, such as RF switches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
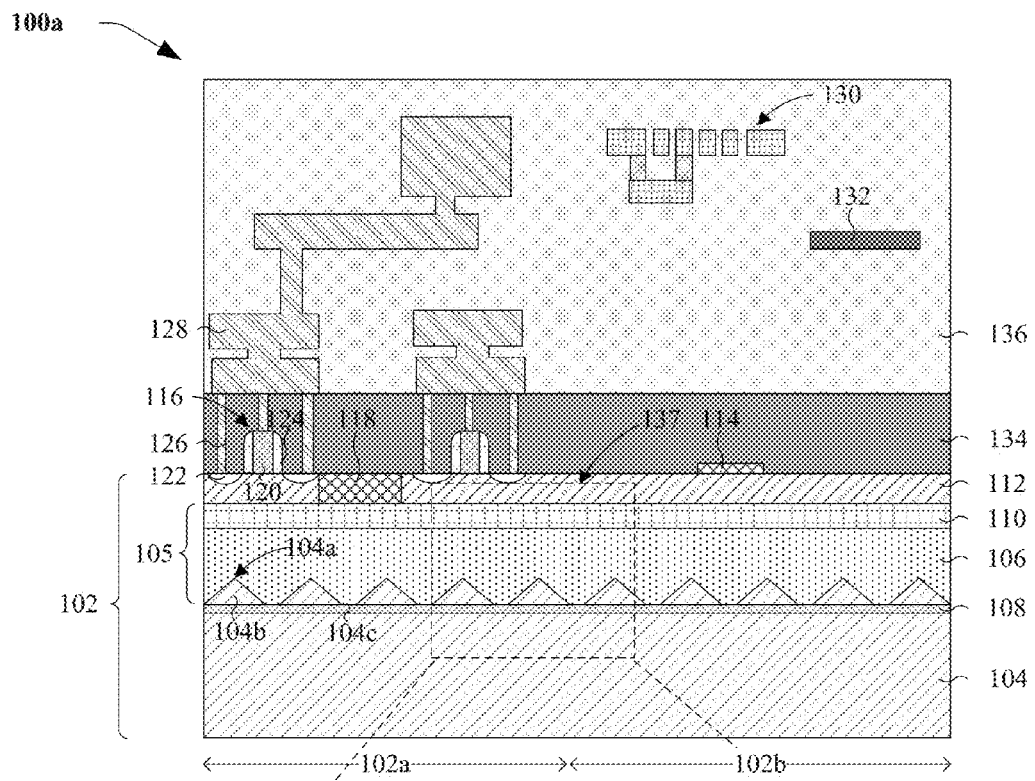
FIG. 1A illustrates a cross-sectional view of some embodiments of an integrated circuit (IC) disposed over a silicon-on-insulator (SOI) substrate, comprising a multi-phase substrate layer and an enriched charge-trapping layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Silicon-on-insulator (SOI) substrates typically use handle substrates having a high resistivity. The use of high resistivity (HR) handle substrates allows for the SOI substrates to meet application requirements, such as device-to-device isolation, passive component Q-factors, etc. It also offers hybrid integration capability and improved radio frequency (RF) performance with CMOS device scaling. All these features make HR-Si (silicon) a very attractive handle substrate for mobile integrated systems. However, the doping in such high resistivity handle substrates is low, such that voltage biases applied to the substrates can cause a layer of surface carriers to build up along a top surface of the high resistivity handle substrate. This layer of surface carriers is a low-resistance layer, which can act as an accumulation or an inversion layer, depending on the type of charges present in an overlying buried oxide layer or insulating layer. Voltages applied to devices within an overlying device layer (for e.g. a thin active layer of silicon) can interact with the accumulation/inversion layer and form eddy currents, which introduces device cross-talk and/or non-linear distortions resulting in RF signal losses.

To prevent such non-linear distortions, SOI substrates may include a charge-trapping layer configured to trap carriers, which is disposed between the handle substrate and the insulating layer. Charge-trapping layers are typically formed by depositing a trap-rich material onto a handle substrate, prior to bonding the handle substrate to the insulating layer or device layer. For example, a charge-trapping layer may be formed by depositing a layer of polysilicon onto a handle wafer prior to bonding the handle wafer to an active silicon wafer. Trap centers located in the crystal defects or polysilicon grain boundaries can repress the eddy currents and reduce RF signal losses, thereby reducing non-linear distortions and device cross-talk. However, these diminished eddy currents can still cause RF signals to reflect from an SOI substrate even with such s a charge-trapping layer.

In view of the foregoing, the present application is directed to a new structure and method to improve charge trapping by the charge-trapping layer. Since trap centers are located in the grain boundaries of the charge-trapping layer, the present disclosure decreases a grain size (e.g. size of an individual silicon crystal) within a polysilicon layer and correspondingly increases the number of grain boundaries, which substantially enriches the charge-trapping layer. An enriched charge-trapping layer can increase recombination for the surface carriers, thereby reducing eddy currents and hence RF losses. For this, an upper surface of the substrate layer or high-resistance silicon layer is roughened to create a multi-phase substrate. A rough surface or a multi-phase surface will make a charge-trapping layer (e.g., un-doped polysilicon) grow in different directions over the handle substrate, resulting in smaller grain size for the charge-trapping layer. In some embodiments, for example, a grain size of polysilicon charge-trapping layer ranges between 1 nanometers (nm) and 10 nm near an interface between the polysilicon trap layer and a Si handle substrate. In some embodiments, a semiconductor substrate, including a first silicon layer having an upper surface with protrusions and indentations is provided. A charge-trapping layer is arranged over the upper surface and configured to trap carriers. An insulating layer is arranged over the charge-trapping layer, and a second silicon layer is arranged over the insulating layer.

Advantageously, the rough surface of the first silicon layer in an SOI substrate increases the grain boundaries of the charge-trapping layer, and facilitates reduction of RF signal losses, thereby improving the performance of an RF circuit formed over the SOI substrate.

With reference to FIG. 1A, a cross-sectional view of some embodiments of an integrated circuit (IC) 100a according to the present disclosure is provided.

The IC 100a includes an SOI substrate 102, which is laterally divided into a first region 102a and a second region 102b. The SOI substrate 102 comprises a handle substrate 104, which has a multi-phase upper surface. In some embodiments, the handle substrate 104 may comprise a high resistivity silicon wafer (i.e., a silicon wafer having a resistivity that is greater than 1 kΩ-cm). An isolation layer 105 is arranged above the handle substrate 104 and a thin low-resistance layer 108 resides between the handle substrate 104 and the isolation layer 105. In some embodiments, the isolation layer 105 comprises a charge-trapping layer 106 and an insulating layer 110 (e.g., a thermal oxide layer, such as $SiO_2$), arranged in that order, which makes the SOI substrate 102 a TR (trap rich) substrate. The insulating layer 110 is configured to electrically isolate the handle substrate 104 from a device layer 112. In some embodiments, the device layer 112 comprises a thin silicon layer. The thin silicon layer provides for advantages, such as faster switching times and lower operating voltages, which have made SOI substrates widely used for high volume fabrication of radio frequency (RF) systems, such as RF switches. In other embodiments, the device layer 112 may comprise alternative semiconductor materials (e.g., a III-V semiconductor material, silicon carbide, silicon germanium, germanium, etc.).

The charge-trapping layer 106 comprises a plurality of crystal grains. In some embodiments, the charge-trapping layer 106 comprises crystal defects comprising dislocations (i.e., areas were the atoms are out of position or misaligned within a crystal lattice), also known as grain boundaries. The grain boundaries are recombination centers configured to trap carriers (e.g., surface carriers from within the handle substrate 104). Once trapped within the recombination centers, the lifetime of the carriers is decreased. Therefore, by trapping carriers within the grain boundaries of the charge-trapping layer 106, the build-up of carriers along a top surface of the handle substrate 104 is reduced substantially, mitigating eddy currents, cross talks or non-linear distortions that results in radio frequency (RF) signal losses.

For improving charge trapping by enriching the charge-trapping layer 106, a top surface of the handle substrate 104 is roughened. For this, in some embodiments, a top surface 104a of the handle substrate 104 is etched in a manner that causes atoms of the handle substrate 104 to be displaced. The displaced atoms cause the top surface 104a of the handle substrate 104 to have a rough surface with protrusions 104b and indentations 104c extending into the overlying charge-trapping layer 106. The protrusions 104b and indentations 104c facilitate the charge-trapping layer 106 to have smaller grain sizes and thus more grain boundaries near the top surface 104a. Thus, most of the surface carriers are trapped at the grain boundaries, and only a thin low-resistance layer 108 is build up along the top surface 104a of the high resistivity handle substrate 104. This low-resistance layer 108 is formed right below the protrusions 104b (since almost all of the carriers over the protrusions 104b and indentations 104c are already recombined at the grain boundaries), and since it is so thin, almost no eddy current is formed along this layer. In some embodiments, an interface between the handle substrate 104 and the charge-trapping layer 106 comprises a series of triangular or pyramid shaped protrusions. For example, the interface may exhibit a saw-toothed profile. In some embodiments, the protrusions can have a height, h, ranging from approximately 10 nm to approximately 1 um, and being approximately 0.5 um in some embodiments. The protrusions can also have a width, w, ranging from approximately 10 nm to approximately 10 um, and being approximately 1 um in some embodiments.

In some embodiments, the device layer 112 further comprises a shallow trench isolation (STI) region 118 disposed within the device layer 112. The device layer 112 may have one or more semiconductor devices formed within and above it. For example, the device layer 112 may comprise passive devices like resistor 114 and locally active devices like field-effect transistors (FET) 116 disposed over it. As illustrated in FIG. 1A, the FETs 116 are disposed over the first region 102a of the SOI substrate 102, separated by the STI region 118. Each FET 116 comprises a gate electrode 120 having source/drain regions 122 disposed on either side of the gate electrode 120, and formed within the device layer 112. In some embodiments, the gate electrode 120 comprises polysilicon or a metal. The gate electrode 120 further has two sidewall spacers 124 disposed along opposing sidewalls of the gate electrode 120. In some embodiments, the sidewall spacers 124 comprise silicon nitride. Metal vias 126 extend into the source/drain regions 122, as well as to a top surface of the gate electrode 120, from a metal stack 128. In some embodiments, the metal vias 126 and the metal stack 128 may comprise, for example, copper, aluminum, gold, titanium or titanium nitride.

The second region 102b of the SOI substrate 102 further comprises an RF area device 130, which may be a transmission line or an inductor, and a capacitor 132. The FETs 116 and the resistor 114 are disposed within a first dielectric layer 134, which is disposed over the device layer 112. The metal stack 128, the RF area device 130 and the capacitor 132 are disposed within a second dielectric layer 136, which is disposed over the first dielectric layer 134. In some embodiments, the first and second dielectric layers, 134 and 136 respectively may be for example, an oxide, a nitride or a low-κ dielectric layer such as, un-doped silicate glass.

Advantageously, the roughened top surface 104a of the handle substrate 104 having protrusions makes the SOI substrate 102 a multi-phase substrate, which can enrich the trap centers of the charge-trapping layer 106. The enriched charge-trapping layer 106 reduces surface carriers, and thus eddy currents, thereby reducing RF signal losses and enhancing RF performance of the IC 100a.

It will be appreciated that IC 100a is just an embodiment that illustrates an RF device, and that the disclosure does not preclude formation of different logic and/or memory devices over the SOI substrate 102. In other words, it is duly submitted that, the SOI substrate 102 having the multi-phase/roughened surface is not limited to RF applications.

Figure 1B:
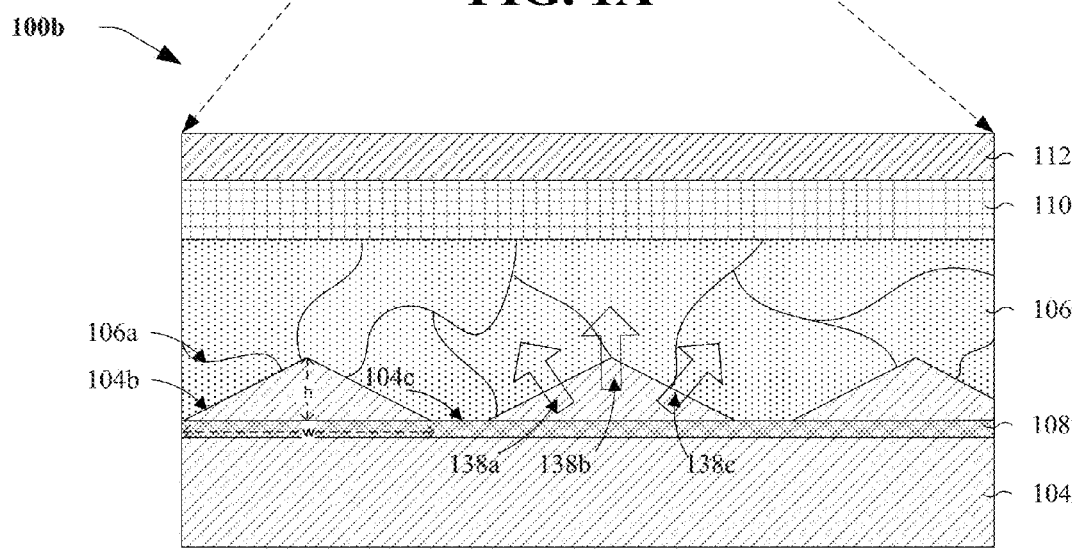
FIG. 1B illustrates a cross-sectional view of an SOI substrate, comprising a multi-phase substrate layer and an enriched charge-trapping layer.

FIG. 1B illustrates a cross-sectional view of a multi-phase substrate 100b, which comprises a handle substrate 104 and an enriched charge-trapping layer 106. FIG. 1B is a zoomed in version of a region 137 in FIG. 1A.

Multi-phase substrate 100b comprises a high-resistivity handle substrate 104 which has protrusions 104b extending into the charge-trapping layer 106. In some embodiments, the high-resistivity handle substrate 104 comprises silicon, having a resistivity greater than 11 kΩ-cm. The charge-trapping layer 106 has an insulating layer 110 disposed over it, and the insulating layer 110 has device layer 112 disposed over it, making region 137 an SOI substrate. The carriers from the high-resistivity handle substrate 104 and the insulating layer 110 interact to form a low-resistance layer 108 along an upper region of the handle substrate 104. As discussed above, the charge-trapping layer 106 is configured to trap these carriers from the low-resistance layer 108, and reduce eddy currents, when the RF area device 130 over the SOI substrate 102 is active. As illustrated by FIG. 1B, the protrusions 104b and indentations 104c make the charge-trapping layer 106 to bond with the atoms of the high-resistivity handle substrate 104 in different lattice directions, such as 138a, 138b, 138c etc. The necessity to bond in different lattice directions would force the grains (individual crystals, e.g., silicon crystal grains of polysilicon) of the charge-trapping layer 106 to be smaller. In some embodiments, the grain size of the charge-trapping layer 106 ranges between 1 nm and 1 μm, with grain sizes increasing as they move away from the rough interface. As the grain size is smaller, the number of grain boundaries 106a is larger, thereby increasing the number of trap centers within the charge-trapping layer 106 compared to conventional approaches.

Advantageously, roughening an upper surface of a high-resistivity substrate wafer and forming a charge-trapping layer over it can substantially reduce the number of carriers formed between an insulator and the substrate wafer, thereby reducing cross-talk and signal losses in an RF system.

Figure 1C:
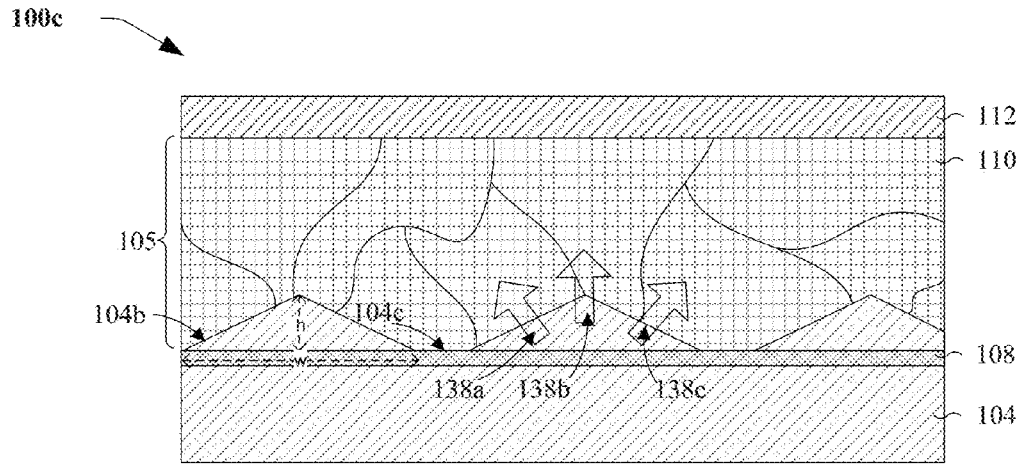
FIG. 1C illustrates a cross-sectional view of an SOI substrate, comprising a multi-phase substrate layer according to some embodiments of the present disclosure.

FIG. 1C illustrates a cross-sectional view of a multi-phase substrate 100c, which comprises a handle substrate 104 and an oxide layer as the isolation layer 105. In this embodiment, the isolation layer 105 comprises only the insulating layer 110 and hence protrusions 104b extend into the insulating layer 110.

Advantageously, the roughened top surface 104a of the handle substrate 104 having protrusions makes the SOI substrate 102 a multi-phase substrate. The multi-phase substrate provides recombination sites for the surface carriers, represses the eddy currents and reduces RF signal losses, thereby reducing non-linear distortions and device cross-talk.

Figure 2:
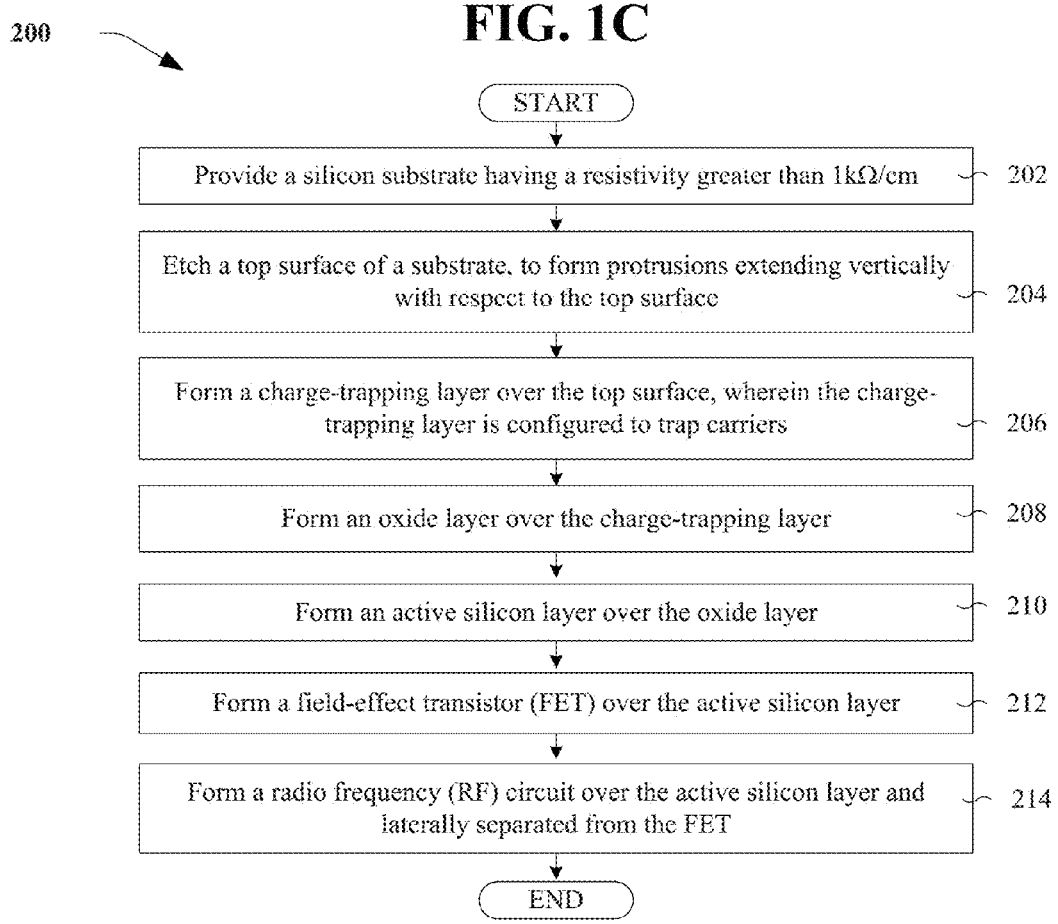
FIG. 2 illustrates a flow diagram of some embodiments of a method of forming a SOI substrate having a multi-phase substrate layer and an enriched charge-trapping layer.

FIG. 2 illustrates a flow diagram of some embodiments of a method 200 for forming a SOI substrate having a multi-phase substrate layer and an enriched charge-trapping layer. While the disclosed method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a silicon substrate having a resistivity greater than 1 kΩ/cm is provided.

At 204, a top surface of the substrate is etched to form protrusions extending vertically with respect to the top surface.

At 206, a charge-trapping layer is formed over the top surface, wherein the charge-trapping layer is configured to trap carriers.

At 208, an oxide layer is formed over the charge-trapping layer.

At 210, an active silicon layer is formed over the oxide layer.

At 212, a field-effect transistor (FET) is formed over the active silicon layer.

At 214, a radio frequency (RF) circuit is formed over the active silicon layer which is laterally separated from the FET.

Advantageously, etching the top surface of the substrate reduces the grain size and thus increases the grain boundaries of the charge-trapping layer formed over the substrate. More grain boundaries/trap centers enrich the charge-trapping layer and ensure more trapping of carriers formed between the substrate and the insulating layer. This new process and resulting structure thus helps in better performance of an RF system formed over the active silicon layer.

With reference to FIGS. 3-9, cross-sectional views of some embodiments of cross-sectional views at various stages of manufacture are provided to illustrate the method of FIG. 2. Although FIGS. 3-9 are described in relation to the method, it will be appreciated that the structures disclosed in FIGS. 3-9 are not limited to the method, but instead may stand alone as structures independent of the method. Similarly, although the method is described in relation to FIGS. 3-9, it will be appreciated that the method is not limited to the structures disclosed in FIGS. 3-9, but instead may stand alone independent of the structures disclosed in FIGS. 3-9.

Figure 3:
FIGS. 3-9 illustrate some embodiments of cross-sectional views showing a method of forming an IC at various stages of manufacture, to illustrate the method of FIG. 2

FIG. 3 illustrates a cross-sectional view 300 of some embodiments of a semiconductor structure corresponding to Act 202 of FIG. 2.

As illustrated by FIG. 3, a high resistivity silicon substrate 104', having a resistivity greater than 1 kΩ/cm is provided. A top surface of the substrate 104', which has a planar topography, is represented by reference numeral 302. In some embodiments, the silicon substrate 104' may have a (100) crystal orientation. In other embodiments, the silicon substrate 104' may have a different crystal orientation (e.g., a (111) crystal orientation).

Figure 4:
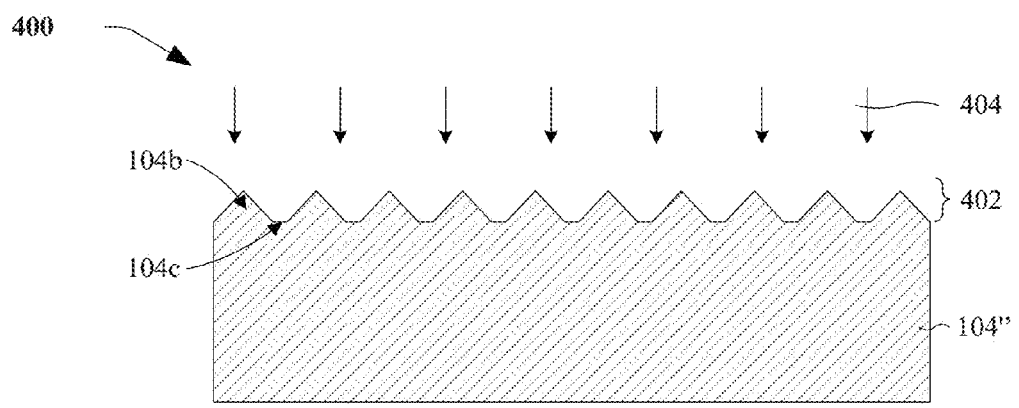

FIG. 4 illustrates a cross-sectional view 400 of some embodiments of a semiconductor structure corresponding to Act 204 of FIG. 2.

As illustrated by FIG. 4, the top surface 302 of the silicon substrate 104' is etched to form protrusion and indentation region 402 within the top surface 302. The protrusion and indentation region 402 is created by first using a photo mask (not shown) to define a pattern on the top surface 302, and then exposing the top surface 302 to an etchant 404, to make the top surface 302 rough with protrusions 104b and indentations 104c. In other embodiments, the silicon substrate 104' may be damaged by mechanically damaging the top surface of the silicon substrate 104' (e.g., micro-scratching, abrasive blasting, etc.), or by performing a deposition or self-assembled monolayer. In some embodiments, the protrusion and indentation region 402 comprises saw-toothed shaped protrusions and corresponding indentations, wherein peaks and valleys of the individual "teeth" are spaced at regular intervals or random intervals. In other embodiments, the protrusion and indentation region 402 comprises random shaped protrusions having different lattice directions and geometries. In some embodiments, the etchant 404 may comprise a dry etchant (e.g., a plasma etchant, an RIE etchant, etc.) or a wet etchant (e.g., hydrofluoric acid).

Figure 5:
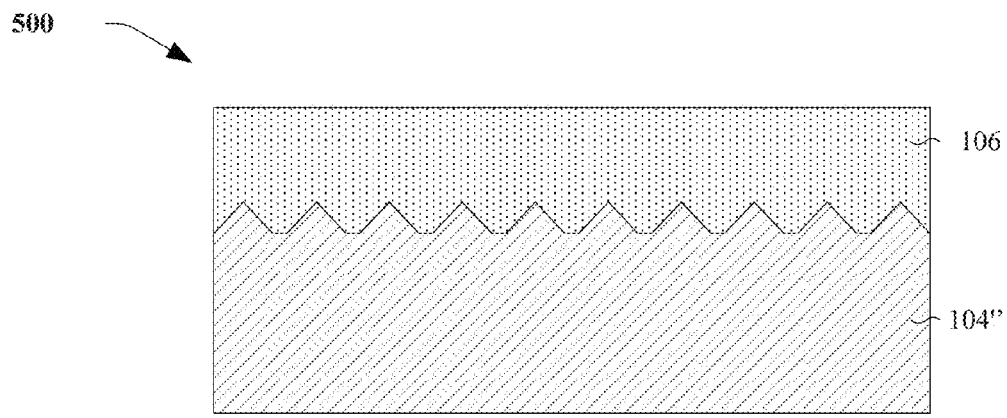

FIG. 5 illustrates a cross-sectional view 500 of some embodiments of a semiconductor structure corresponding to Act 206 of FIG. 2.

Figure 6:
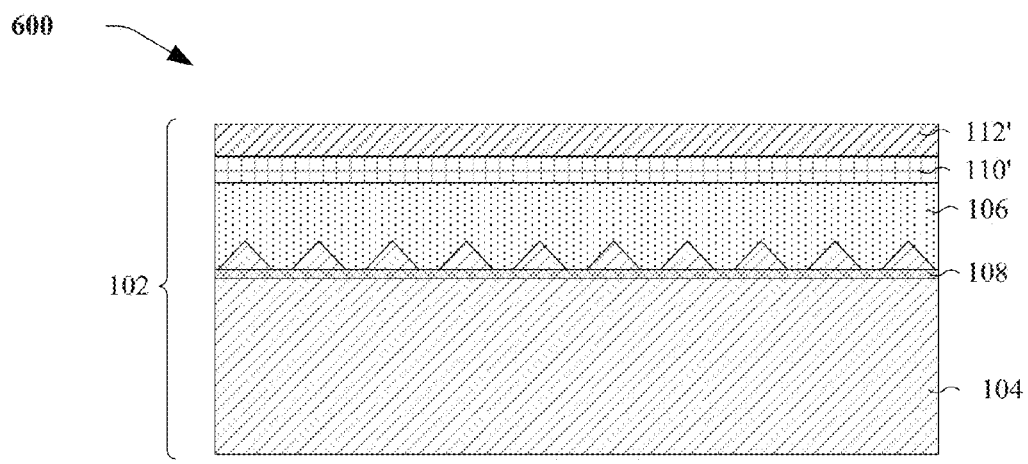

As illustrated by FIG. 5, a charge-trapping layer 106 is formed over the protrusion and indentation region 402. The charge-trapping layer 106 have smaller grain size (ranging between 1 nm and 100 nm) near the protrusion and indentation region 402 and hence more grain boundaries near the protrusion and indentation region 402. In some embodiments, the charge-trapping layer comprises polycrystalline silicon. In other embodiments, the charge-trapping layer 106 may comprise a remnant of a dopant species implanted into the silicon substrate 104' to form an amorphous material. In various embodiments, the remnant dopant species may comprise argon (Ar), carbon (C), and/or germanium (Ge). In some embodiments, an interface between the silicon substrate 104' and the charge-trapping layer 106 comprises a saw-toothed profile. FIG. 6 illustrates a cross-sectional view 600 of some embodiments of a semiconductor structure corresponding to Acts 208 and 210 of FIG. 2.

As illustrated by FIG. 6, an oxide layer 110' is formed over the charge-trapping layer 106, and an thin silicon layer 112' is formed over the oxide layer 110'. Interaction between the carriers in the oxide layer 110' and that in the silicon substrate 104' forms a thin layer of surface carriers along the protrusion and indentation region 402 to form a thin low-resistance layer 108 below the protrusions 104b and indentations 104c. The excess grain boundaries in the charge-trapping layer 106 above the protrusion and indentation region 402, traps these surface carriers.

Advantageously, the 3D topography of the silicon substrate 104' enhances charge trapping and reduces the number of surface carriers along the upper regions of the silicon substrate 104'. The reduction in surface carriers mitigates formation of accumulation/inversion layers, that occurs during voltage signal variations in an RF device formed in the thin silicon layer 112', thereby preventing unwanted RF signal losses. In some embodiments, the oxide layer 110' comprises silicon dioxide. In some embodiments, a direct bonding process may be used to bond the thin silicon layer 112' to the silicon substrate 104' by way of the oxide layer 110'. As illustrated by FIG. 6, the bonding creates an SOI substrate 102 that has a handle substrate with multi-phase topography.

Figure 7:
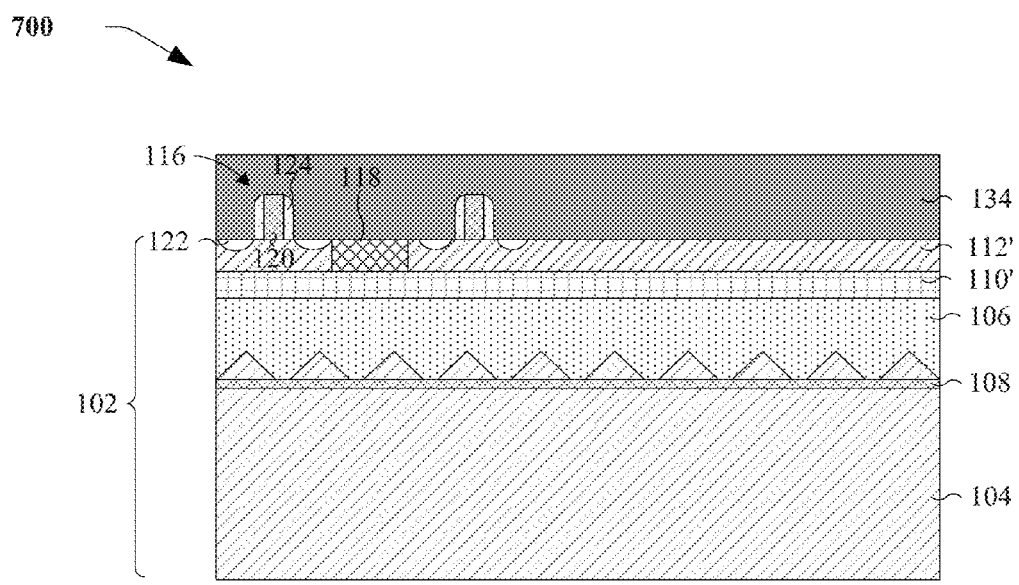

FIG. 7 illustrates a cross-sectional view 700 of some embodiments of a semiconductor structure corresponding to Act 212 of FIG. 2.

As illustrated by FIG. 7, a field-effect transistor (FET) 116, which is an interlinked part of an RF area device (e.g. RF switch) is formed within the thin silicon layer 112'. The thin silicon layer 112' further has an STI region 118, and source/drain regions 122 disposed within its body. FET 116 has gate electrode 120 surrounded by sidewall spacers 124 on opposing sidewalls. A first dielectric layer 134 fills in the space between the FET 116 disposed above the device layer 112. In some embodiments, the gate electrode 120 comprises polysilicon or a metal, and the sidewall spacers 124 comprise silicon nitride.

Figure 8:
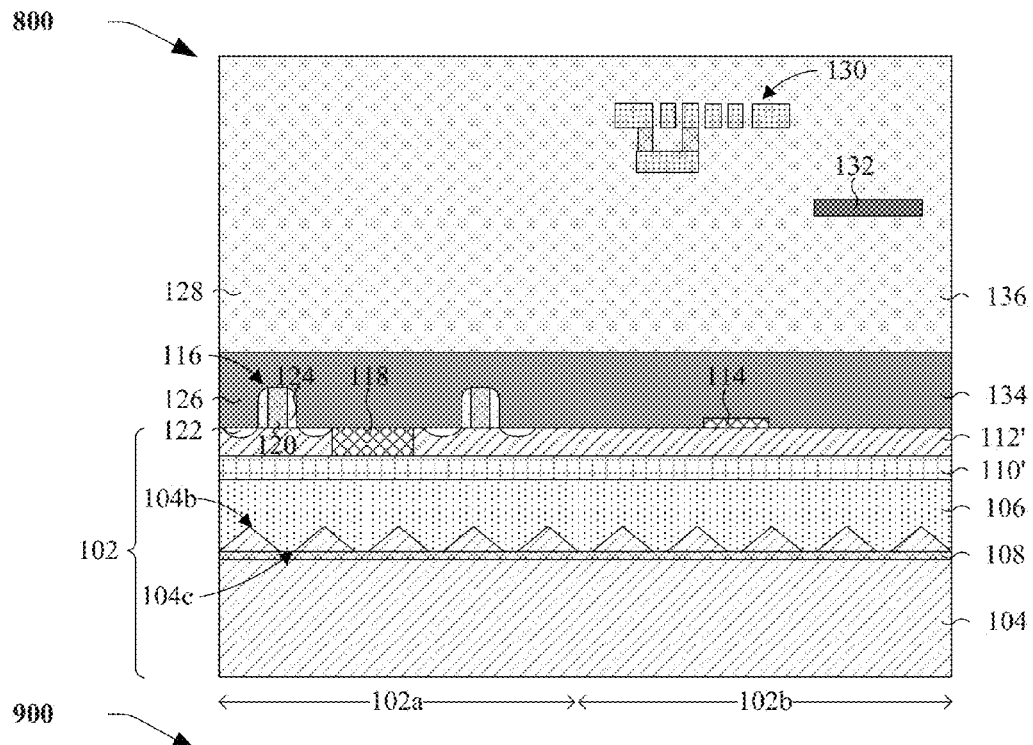

FIG. 8 illustrates a cross-sectional view 800 of some embodiments of a semiconductor structure corresponding to Act 214 of FIG. 2.

As illustrated by FIG. 8, an RF area device 130, such as an RF transmission line or inductor is formed over a second region 102b of the SOI substrate 102. The second region 102b also includes passive devices such as a resistor 114 and a capacitor 132. The RF area device 130 and the capacitor 132 are disposed within a second dielectric layer 136, which is disposed over the first dielectric layer 134. In some embodiments, the first and second dielectric layers, 134 and 136 respectively comprise an oxide or a nitride.

Figure 9:
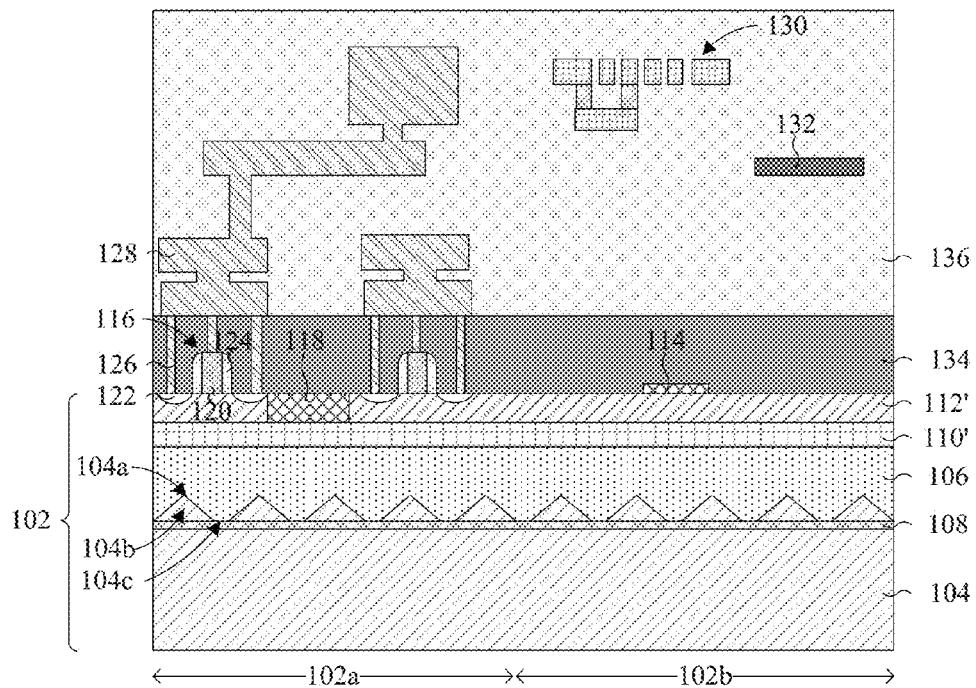

FIG. 9 illustrates a cross-sectional view 900 of some embodiments of a semiconductor structure corresponding to Act 214 of FIG. 2.

As illustrated by FIG. 9, metal vias 126 are formed extending into the source/drain regions 122 and over to the gate electrode 120. The metal vias 126 extend from a metal stack 128 formed within the second dielectric layer 136. The metal vias 126 and the metal stack 128 may be formed, for example, from a material with a metallic component (e.g., aluminum, copper, tantalum, titanium, and/or tungsten), such as titanium nitride. In some embodiments, the metal vias 126 and metal stack 128 are formed by first forming via openings and trenches (not shown) by one or more photolithography processes, and later filling them with a metallic component.

Advantageously, the protrusion and indentation region 402 enables the charge-trapping layer to grow in random directions and thus have smaller grain size. The smaller grain size results in an increased number of grain boundaries. The increased number of grain boundaries absorbs more surface carriers formed at the interface between the silicon substrate 104' and the charge-trapping layer 106. This in-turn represses the eddy currents and reduces RF signal losses, thereby reducing non-linear distortions and device cross-talk. Accordingly, a multi-phase handle substrate can enrich a charge-trapping layer in an SOI substrate.

Thus, as can be appreciated from above, the present disclosure is directed to a semiconductor substrate, comprising a first silicon layer comprising an upper surface with protrusions extending vertically with respect to the upper surface. An isolation layer is arranged over the upper surface meeting the first silicon layer at an interface, and a second silicon layer is arranged over the isolation layer.

In other embodiments, the present disclosure is directed to an integrated circuit comprising, a first silicon layer and a charge-trapping layer arranged over the first silicon layer. The charge-trapping layer is configured to trap carriers and, an interface between the first silicon layer and the charge trapping layer comprise a saw-toothed profile. An oxide layer is arranged over the charge-trapping layer, and a second silicon layer arranged over the oxide layer.

In yet other embodiments, the present disclosure is directed to a method of forming a silicon-on-insulator (SOI) substrate. The method comprises, providing a silicon substrate having a resistivity greater than 1 kΩ/cm. A top surface of the silicon substrate is roughened to form a protrusion and indentation region within the top surface. A charge-trapping layer is formed over the protrusion and indentation region, wherein the charge-trapping layer is configured to trap carriers. An oxide layer is formed over the charge-trapping layer, and an active silicon layer is formed over the oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor substrate, comprising:
a first silicon layer comprising an upper surface with protrusions extending vertically with respect to the upper surface;
an isolation layer arranged over the upper surface of the first silicon layer and meeting the first silicon layer at an interface, wherein the isolation layer comprises a charge trapping layer arranged over and contacting the upper surface of the first silicon layer, and wherein the charge trapping layer is un-doped polysilicon; and
a second silicon layer arranged over the isolation layer.

2. The semiconductor substrate of claim 1, wherein the upper surface of the first silicon layer comprises triangular or pyramidal-shaped protrusions.

3. The semiconductor substrate of claim 1, wherein the isolation layer comprises an oxide layer.

4. The semiconductor substrate of claim 1, wherein the second silicon layer comprises source/drain regions for a pair of neighboring logic devices.

5. The semiconductor substrate of claim 4, wherein the second silicon layer includes a shallow trench isolation (STI) region between the neighboring logic devices.

6. The semiconductor substrate of claim 1, wherein the interface between the isolation layer and the first silicon layer has a saw-toothed profile.

7. The semiconductor substrate of claim 1, wherein a lattice of the first silicon layer has multiple directions.

8. The semiconductor substrate of claim 1, wherein the charge trapping layer is configured to trap carriers, and wherein the isolation layer comprises:
an oxide layer arranged over an upper surface of the charge trapping layer.

9. An integrated circuit comprising:
a first silicon layer comprising an upper surface with protrusions and indentations;
a charge trapping layer arranged over the upper surface of the first silicon layer and configured to trap carriers, wherein the charge trapping layer is arranged over the first silicon layer, and wherein an interface between the first silicon layer and the charge trapping layer comprises a saw-toothed profile;
an oxide layer arranged over an upper surface of the charge trapping layer; and
a second silicon layer arranged over the oxide layer.

10. The integrated circuit of claim 9, wherein the first silicon layer has a resistivity greater than 1 k$\Omega$/cm.

11. The integrated circuit of claim 9, further comprising:
a passive radio frequency (RF) device arranged over the second silicon layer.

12. The integrated circuit of claim 9, further comprising:
a field-effect transistor (FET) arranged over the second silicon layer.

13. The integrated circuit of claim 12, further comprising:
a metal stack arranged over the second silicon layer and electrically coupled to the FET.

14. The integrated circuit of claim 9, wherein the charge trapping layer is un-doped polysilicon.

15. An integrated circuit comprising:
a first semiconductor layer comprising a rough upper surface;
a charge-trapping layer arranged over and contacting the rough upper surface of the first semiconductor layer;
a dielectric layer arranged over the charge-trapping layer;
a second semiconductor layer arranged over the dielectric layer; and
a logic device arranged over the second semiconductor layer, wherein the logic device comprises source/drain regions arranged in the second semiconductor layer.

16. The integrated circuit according to claim 15, wherein the first semiconductor layer is silicon with a resistivity greater than about 1 k$\Omega$/cm, wherein the charge-trapping layer is un-doped polysilicon, wherein the dielectric layer is oxide, and wherein the second semiconductor layer is silicon.

17. The integrated circuit according to claim 16, wherein the dielectric layer contacts the charge-trapping layer, and wherein the second semiconductor layer contacts the dielectric layer.

18. The integrated circuit according to claim 15, further comprising:
a metal stack arranged over the logic device and electrically coupled to the logic device by a metal via.

19. The integrated circuit according to claim 15, wherein the rough upper surface of the first semiconductor layer has a saw-toothed profile.

20. The integrated circuit according to claim 15, wherein the charge-trapping layer comprises crystal grains, and wherein the crystal grains are smaller along the rough upper surface of the first semiconductor layer than along an upper surface of the charge-trapping layer.

* * * * *